(12) United States Patent
Arita et al.

(10) Patent No.: US 8,038,864 B2
(45) Date of Patent: Oct. 18, 2011

(54) METHOD OF FABRICATING SEMICONDUCTOR DEVICE, AND PLATING APPARATUS

(75) Inventors: Koji Arita, Kanagawa (JP); Ryohei Kitao, Tsuruoka (JP)

(73) Assignee: Renesas Electronics Corporation, Kanagawa (JP)

( * ) Notice: Subject to any disclaimer, the term of this patent is extended or adjusted under 35 U.S.C. 154(b) by 867 days.

(21) Appl. No.: 11/829,129

(22) Filed: Jul. 27, 2007

(65) Prior Publication Data
US 2008/0023335 A1      Jan. 31, 2008

(30) Foreign Application Priority Data
Jul. 27, 2006   (JP) .................... 2006-204535

(51) Int. Cl.
*C25D 21/12* (2006.01)
(52) U.S. Cl. ........................................... 205/82
(58) Field of Classification Search .............. 205/82, 205/157, 118
See application file for complete search history.

(56) References Cited

U.S. PATENT DOCUMENTS

| | | | |
|---|---|---|---|
| 6,140,241 A | 10/2000 | Shue et al. | |
| 6,319,831 B1 | 11/2001 | Tsai et al. | |
| 7,189,318 B2 * | 3/2007 | Wilson et al. | 700/266 |
| 7,232,513 B1 * | 6/2007 | Webb et al. | 205/298 |
| 2004/0262165 A1 * | 12/2004 | Kanda et al. | 205/128 |

FOREIGN PATENT DOCUMENTS

| | | |
|---|---|---|
| JP | 2001123298 | 5/2001 |
| JP | 2004270028 | 9/2004 |
| JP | 2005039142 | 2/2005 |
| JP | 2005264271 | 9/2005 |
| JP | 2006060011 | 3/2006 |

* cited by examiner

*Primary Examiner* — Luan Van
(74) *Attorney, Agent, or Firm* — Young & Thompson

(57) ABSTRACT

A method of fabricating a semiconductor device of the invention includes a plating process of filling a plurality of recesses provided to an insulating film formed on a substrate with an electro-conductive material, wherein the plating process includes a process step (S104) of performing the plating with a first current density which was obtained by correcting a predetermined first reference current density based on ratio of surface area $Sr=S_1/S_2$ of a first surface area $S_1$ over the entire surface of the substrate which includes the area of side walls of the plurality of recesses over the entire surface of the semiconductor substrate, and a second surface area $S_2$ over the entire surface of the substrate which does not include the area of side walls of the plurality of recesses, when fine recesses not larger than a predetermined width, out of all of the plurality of recesses, are filled with the electro-conductive material.

15 Claims, 6 Drawing Sheets

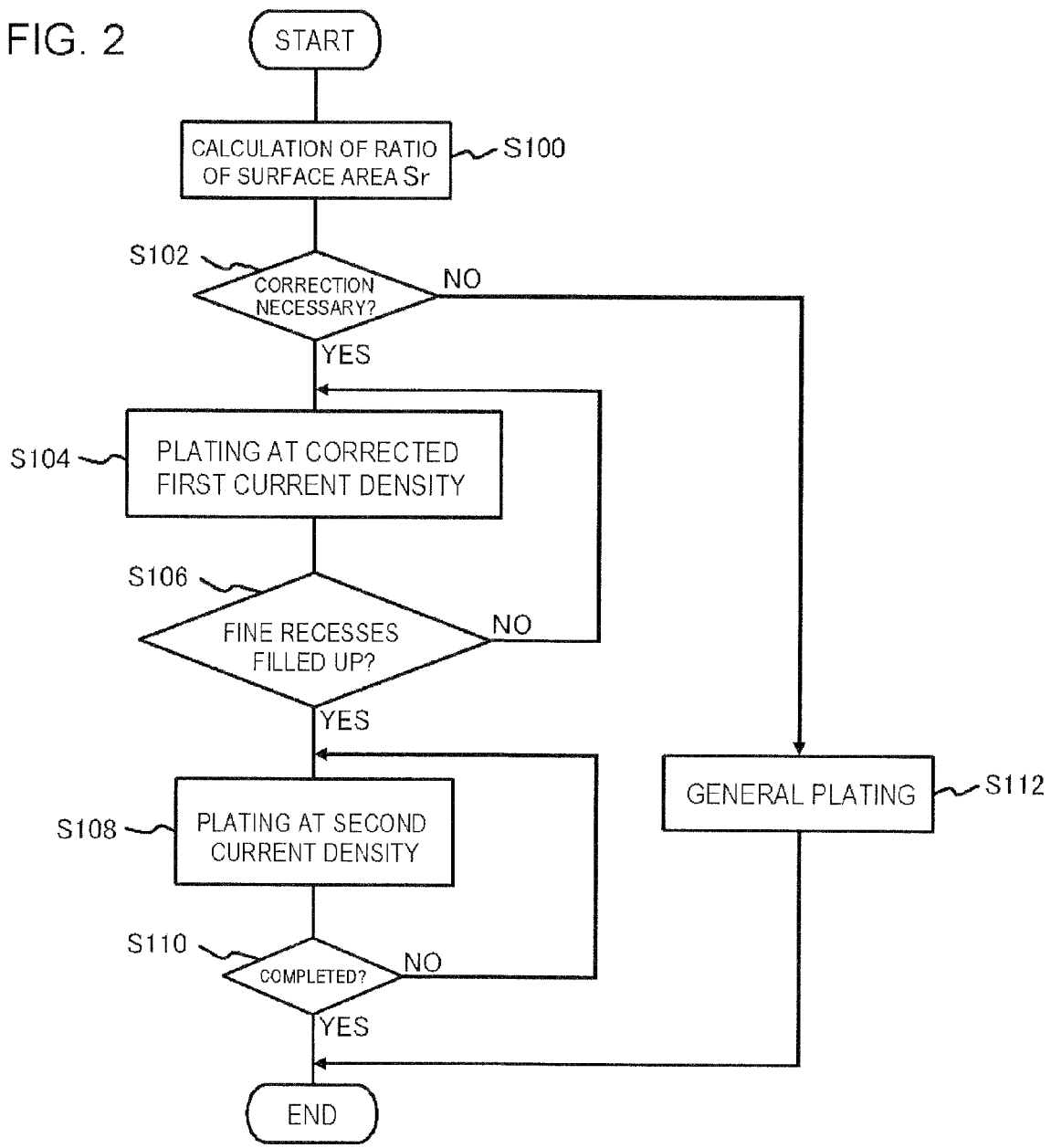

FIG. 4

| | RATIO OF SURFACE AREA | | CURRENT VALUE PRESET ON APPARATUS | FIRST CURRENT DENSITY | EFFECTIVE CURRENT DENSITY $(mA/cm^2)$ | |
|---|---|---|---|---|---|---|
| | LOWER LIMIT (NOT LOWER THAN) | UPPER LIMIT (LOWER THAN) | (A) | $(mA/cm^2)$ | LOWER LIMIT | UPPER LIMIT |
| GROUP A | 1 | 1.2 | 3 | 4.4 | 3.6 | 4.4 |
| GROUP B | 1.2 | 1.4 | 3.5 | 5.1 | 3.6 | 4.2 |
| GROUP C | 1.4 | 1.6 | 4 | 5.8 | 3.6 | 4.2 |
| GROUP D | 1.6 | 1.8 | 4.5 | 6.5 | 3.6 | 4.1 |
| GROUP E | 1.8 | 2 | 5 | 7.3 | 3.6 | 4.0 |
| GROUP F | 2 | 2.2 | 5.5 | 8.0 | 3.6 | 4.0 |
| GROUP G | 2.2 | 2.4 | 6 | 8.7 | 3.6 | 4.0 |
| GROUP H | 2.4 | 2.6 | 6.5 | 9.4 | 3.6 | 3.9 |

METHOD OF FABRICATING SEMICONDUCTOR DEVICE, AND PLATING APPARATUS

This application is based on Japanese patent application No. 2006-204535 the content of which is incorporated hereinto by reference.

BACKGROUND

1. Technical Field

The present invention relates to a method of fabricating a semiconductor device, adopted to a process of forming by plating an electro-conductive film on an insulating film having a plurality of recesses formed therein, and a plating apparatus.

2. Related Art

In semiconductor devices using copper interconnect, there is an increasing demand on improved performance in filling of holes and trenches by copper plating, with progress of scaling of interconnect patterns as a result of shrinkage of design rule.

U.S. Pat. No. 6,319,831 and U.S. Pat. No. 6,140,241 describe procedures in which a first plating is carried out at a lower current density, and a second plating is then carried out at a higher current density.

Japanese Laid-Open Patent Publication No. 2001-123298 describes a technique of electrolytic plating. In this document, a mathematical relationship between current density and potential of electrode is determined by using an electrode composed of the same material with an object to be plated, and then the object to be plated is polarized in a plating bath at an arbitrary potential or current. A current value and potential value of the polarized object are measured, then an area of the object to be plated is calculated based on the mathematical relationship, the current value and potential value. Thus the calculated area of the object to be plated is used for electrolytic plating. More specifically, an interconnect pattern is formed on a substrate by a photolithographic technique using a photosensitive resist for plating, and the current value is then measured by allowing the substrate to polarize, in order to determine the exposed area of the electrode not covered by the photosensitive resist, that is, the area to be plated. The area of the substrate to be plated is then calculated based on the current value. Current value for the plating is then determined based on the calculated area.

Japanese Laid-Open Patent Publication No. 2005-264271 describes a method of fabricating a semiconductor device which includes a step of acquiring a ratio of fine recesses having width not larger than a first reference width in a layer having a plurality of recesses formed therein, a step of determining integrated current value necessary for filling up the recesses with an electro-conductive material based on the ratio, and a step of forming an electro-conductive layer by the electroplating process, based on thus-determined integrated current value. It is described that the method can successfully form an electroplated film with an appropriate thickness.

Japanese Laid-Open Patent Publication No. 2006-60011 describes a method of fabricating a semiconductor device which includes a first plating process allowing current having a first current density to flow using as an electrode a seed film formed on the surface of an insulating film and in openings, so as to deposit an electro-conductive material in the openings by the plating process, a second plating process following the first plating process, allowing current having a current density smaller than the first current density to flow so as to deposit the electro-conductive material on the surface of the insulating film by the plating process, and an annealing process following the second plating process, annealing the product.

Japanese Laid-Open Patent Publication No. 2005-39142 describes a method of fabricating a semiconductor device which includes a first step allowing electrolytic plating to proceed so as to fill at least either one of interconnect trenches and holes formed in an insulating film on a semiconductor substrate with an electro-conductive layer, under a condition such that an integrated current density, which is a product of current density (a current value per unit area of a cathode electrode, that is a wafer to be plated) and plating time, is kept at a predetermined value, and a second step allowing plating to proceed under a condition such that the current density is kept smaller than that in the first step. It is described that adoption of the electrolytic plating method in this patent publication can successfully improve filling performance of the electro-conductive layer formed in the interconnect trenches and holes, and can improve uniformity of bottom-up performance over the entire surface of wafer.

Japanese Laid-Open Patent Publication No. 2004-270028 describes a method of damascene copper plating, including a step of allowing current to flow, only in the direction opposite to the current direction corresponding to the growth of the plated film during plating. The method can prevent the plated film from piling up in the area where the interconnect is densely distributed, and can consequently avoid increase in the cost due to increase in the process time of CMP.

A plating apparatus generally has a preset recipe describing predetermined reference current density applied to the works to be plated and plating time. On the other hand, a substrate of a semiconductor device may have various interconnect patterns depending on design. A substrate having a lot of fine patterns need longer time for the plating, as compared with a substrate having only a less amount of fine patterns. For this reason, plating various substrates of semiconductor devices having different designs under the same current density and the same duration of time has a problem in that the semiconductor devices having a less amount of fine patterns causes excessive growth of the plated film, if the plating is allowed to proceed on the basis of the semiconductor devices having a lot of fine patterns. The excessive growth of the plated film is causative of unnecessary costs due to unnecessarily large consumption of plating material, takes a longer time for the succeeding CMP or other processing, and results in lowering in throughput. On the contrary, plating on the basis of the semiconductor devices having only a less amount of fine patterns raises a problem in that the semiconductor devices having a lot of fine patterns suffers from insufficient formation of the plated film. In particular, the fine recesses cannot thoroughly be plated, leaving voids or the like formed in the recesses. These problems have been remained unsolved.

After extensive investigations into the above-described phenomena, the present inventors found out that, when the recesses of the semiconductor devices are filled with an electro-conductive material by plating, the above-described problems are ascribable to large difference in effective surface area for the plating, as a result of large difference in the area of the side walls of the recesses depending on the density of interconnect pattern.

However, these problems have been left unsolved. For example, Japanese Laid-Open Patent Publication No. 2001-123298 determines a current value for plating based on the area of the electrode to be plated, but makes no consideration on characteristics of filling of the recesses with the electro-conductive material by plating. In other words, accurate correction cannot be given, because there is no consideration on the area of side walls of the recesses. Japanese Laid-Open Patent Publication No. 2005-264271 determines the integrated current value depending on ratio of the fine recesses to the layer, but makes no consideration on the effective surface area for plating, and therefore gives no accurate correction.

SUMMARY

In one embodiment, there is provided a method of fabricating a semiconductor device having a plating process of filling a plurality of recesses provided to an insulating film formed on a substrate with an electro-conductive material, wherein the plating process includes performing the plating with a first current density when fine recesses not larger than a predetermined width, out of all of the plurality of recesses, are filled with the electro-conductive material, the first current density being obtained by correcting a predetermined first reference current density based on ratio of surface area $Sr=S_1/S_2$ of a first surface area $S_1$ over the entire surface of the substrate which includes the area of side walls of the plurality of recesses over the entire surface of the substrate, and a second surface area $S_2$ over the entire surface of the substrate which does not include the area of side walls of the plurality of recesses. In the present invention, $S_1$ is referred to as the effective surface area, and the effective current density corresponds to the current divided by $S_1$.

In another embodiment, there is provided a plating apparatus filling a plurality of recesses, which are contained in a semiconductor device and provided to an insulating film formed on a substrate, with an electro-conductive material, comprising: a data memory unit storing a first reference current density which is to be applied to the semiconductor device to be plated; a calculation unit acquiring ratio of surface area $Sr=S_1/S_2$ of a first surface area $S_1$ over the entire surface of the substrate of the semiconductor device to be plated which includes the area of side walls of the plurality of recesses over the entire surface, and a second surface area $S_2$ over the entire surface which does not include the area of side walls of the plurality of recesses, and calculating the first current density by correcting the first reference current density based on the ratio of surface area Sr; and a plating unit plating the semiconductor device to be plated, at the first current density calculated by the calculation unit.

The first surface area $S_1$ herein may be defined as the sum of a value obtained by multiplying the sum of the individual perimeters of the plurality of recesses on the substrate by the depth of the recesses, and the surface area of the entire substrate (second surface area $S_2$).

According to the method of fabricating a semiconductor device of the embodiments, when the fine recesses not larger than a predetermined width are filled with the electro-conductive material, the current density is corrected taking the area of side walls of the recesses into consideration. For this reason, the current density can be kept at an approximately constant level, irrespective of the patterns of the recesses formed on the semiconductor device. It is therefore made possible to improve the bottom-up performance in the plating process, and to form the plated film in a well-controlled manner. Because the current density can be kept at an approximately constant level, also properties of the plated film, such as grain size, alignment and so forth, can be made uniform, and thereby the film characteristics can be improved.

The above-described effect can be obtained by allowing the most part of the plating process, until the fine recesses are filled up, to proceed under thus-corrected current density. In other words, the present invention is not precluded from allowing the plating to proceed without adopting thus-corrected current density, for a short duration of time at the initial stage or middle stage of the plating process. After the fine recesses were filled up, it is also allowable to proceed the plating under a larger current density without such correction. The throughput can therefore be improved.

According to the present invention, thickness of the plated film can be controlled in an accurate manner.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a flow chart showing procedures of the plating process in the embodiment of the present invention;

FIG. 4 is a drawing showing a plurality of groups, ranges of the ratio of surface area Sr for the individual groups, and relations with current density to be applied;

DETAILED DESCRIPTION

Figure 1A:
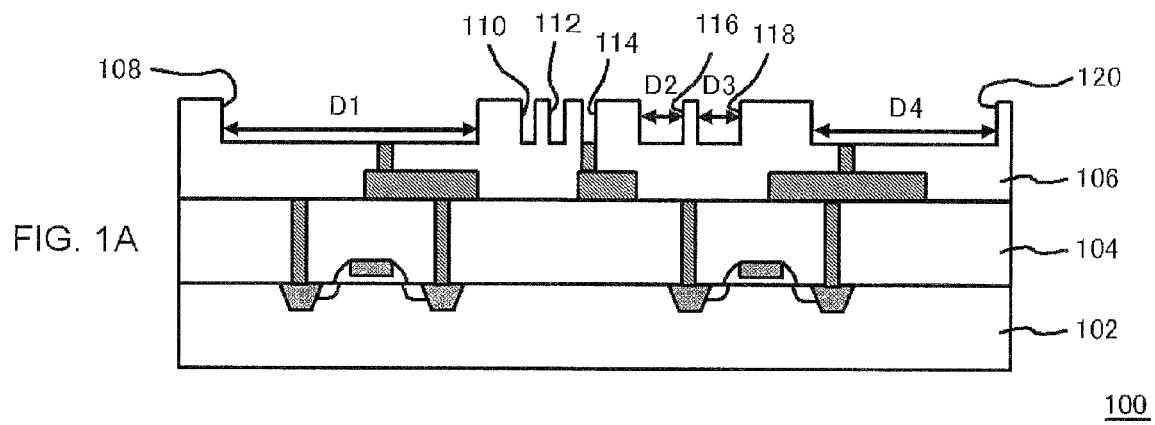
FIGS. 1A to 1C are sectional views of process steps showing procedures of fabricating a semiconductor device according to an embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention referring to the attached drawings. It is to be noted that any similar constituents will be given with similar reference numerals, so as to occasionally avoid repetitive explanation.

First Embodiment

Figure 1B:
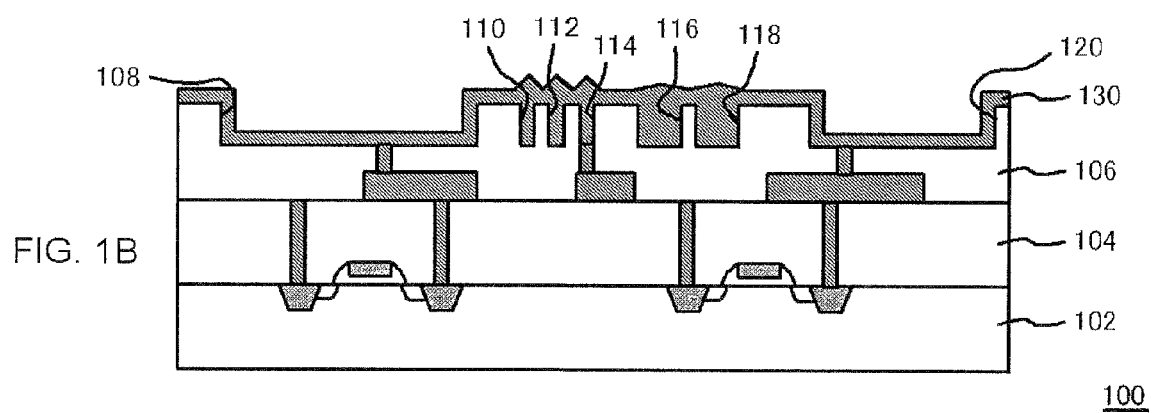
Figure 1C:
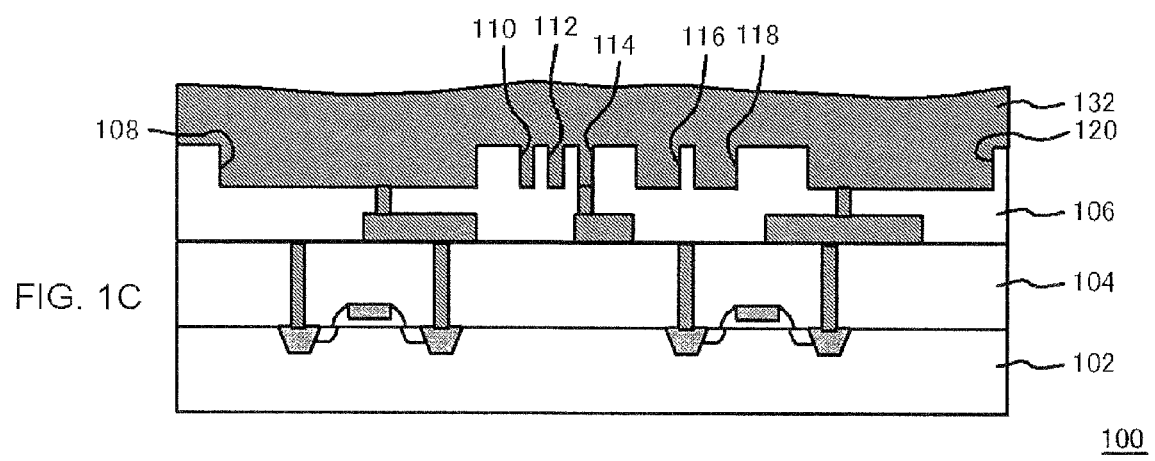

FIGS. 1A to 1C are sectional views of process steps showing procedures of fabricating a semiconductor device 100 according to this embodiment. In this embodiment, processes of forming interconnects in an interlayer insulating film 106 will be explained. In this embodiment, procedures for forming copper interconnects based on the damascene process will be explained.

The semiconductor device 100 includes a semiconductor substrate (substrate) 102 having transistors and so forth formed therein, an interlayer insulating film 104 formed on the semiconductor substrate 102, and an interlayer insulating film 106 formed further thereon. The interlayer insulating film 104 and the interlayer insulating film 106 have interconnects and viaholes formed therein.

In thus-configured semiconductor device 100, first, interconnect trenches are formed in the interlayer insulating film 106. In this process, as shown in the drawing, a first interconnect trench 108, a second interconnect trench 110, a third interconnect trench 112, a fourth interconnect trench 114, a fifth interconnect trench 116, a sixth interconnect trench 118, and a seventh interconnect trench 120 are formed in the interlayer insulating film 106.

The first interconnect trench 108 has interconnect line width $D_1$, the fifth interconnect trench 116 has interconnect line width $D_2$, the sixth interconnect trench 118 has interconnect line width $D_3$, and the seventh interconnect trench 120 has interconnect line width $D_4$. Interconnect line width $D_2$ of the fifth interconnect trench 116 is nearly equal to interconnect line width $D_3$ of the sixth interconnect trench 118, adjusted to 0.3 μm for example. Interconnect line width $D_1$ of the first interconnect trench 108 and interconnect line width $D_4$ of the seventh interconnect trench 120 are wider than interconnect line width $D_2$ and interconnect line width $D_3$. The second interconnect trench 110, the third interconnect trench 112, and the fourth interconnect trench 114 are narrower than interconnect line width $D_2$ and interconnect line width $D_3$.

Procedures of filling these interconnect trenches (recesses) with an interconnect material are as follows. First, a barrier metal film is formed in the recesses of the interlayer insulating film 106. The barrier metal film may be such as that used for general copper interconnect, typically TaN/Ta and so forth. Next, a seed film for the plating is formed on the barrier metal film. The seed film herein may be a copper film or the like formed typically by the CVD process.

Thereafter, the plating process is carried out. In this embodiment, the plating process differs from the general ones. In this embodiment, a plating solution may be same as that generally used for forming a plated film in the process of forming copper interconnects. The plating solution may contain sulfuric acid, copper and chlorine. The plating solution may contain also additives such as suppressor, accelerator (carrier) and leveler. The plating process in this embodiment proceeds according to a mode of bottom-up deposition.

FIG. 2 is a flow chart showing procedures of the plating process in this embodiment.

In this embodiment, a predetermined reference current density and plating time are preliminarily set. In this embodiment, a first reference current density, and a second reference current density larger than the first reference current density are set as the reference current density. The plating process is proceeded in two steps. Plating process based on the first reference current density is allowed to proceed until the fine recesses in the interconnect pattern are filled up, and thereafter, plating process based on the second reference current density are allowed to proceed. The predetermined reference current density herein refers to an effective current density applied to the semiconductor device 100, when the ratio of surface area Sr (which will be described later) is 1.

In this embodiment, the first reference current density is set so as to make the effective current density applied to the semiconductor device 100 is adjusted to the predetermined value which is equal to or more than 2 mA/cm² and equal to or less than 6.5 MA/cm², when the ratio of surface area Sr (which will be described later) is 1, more preferably equal to or more than 3.5 mA/cm² and equal to or less than 5 mA/cm². Now the plating process can proceed in a region not causative of insufficient filling and abnormal plating.

In this state, ratio of surface area $Sr=S_1/S_2$ of the first surface area $S_1$ over the entire surface of the semiconductor substrate (wafer) including the area of side walls of the plurality of recesses over the entire surface of the semiconductor substrate and the second surface area $S_2$ over the entire surface of the semiconductor substrate not including the area of side walls of the plurality of recesses is calculated (S100). The reference current density is set on the basis of the second surface area $S_2$. A semiconductor substrate, assumed now as a silicon wafer of 300 mm in diameter (14.8 cm in radius when edge exclusion is supposed 2 mm), gives $S_2$ of 688 cm².

Figure 3:
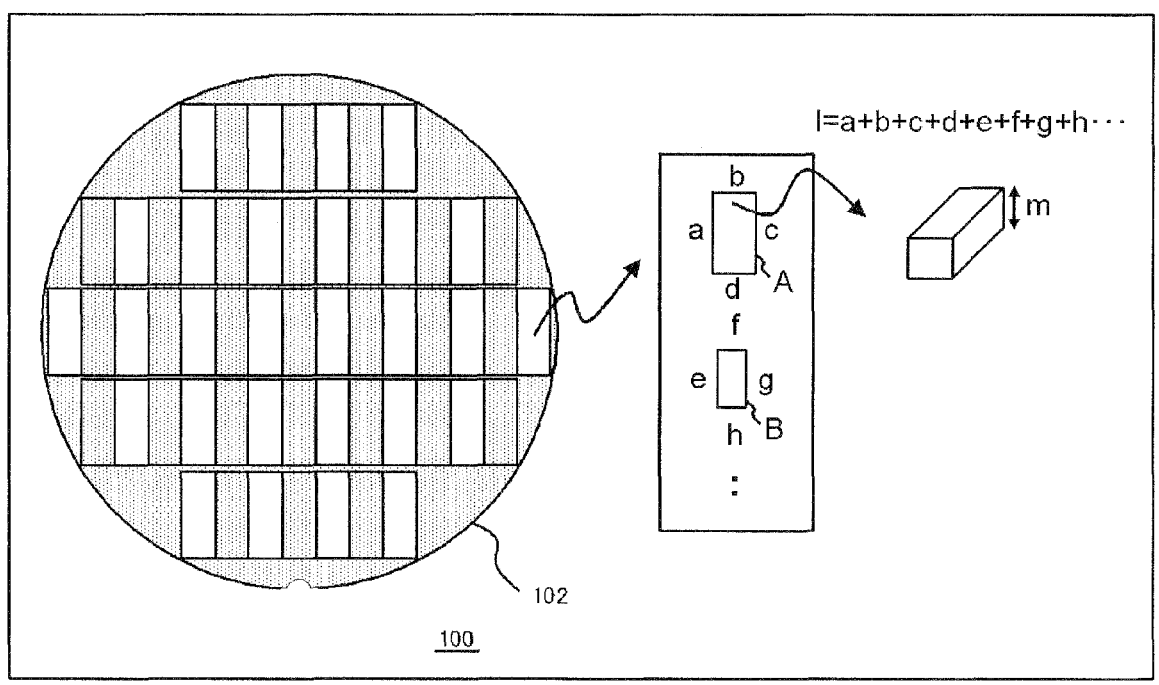
FIG. 3 is a drawing schematically showing the semiconductor device.

Procedures of calculating the ratio of surface area Sr will be explained referring to FIG. 3. FIG. 3 is a drawing schematically showing the semiconductor device 100. In the drawing, the blank portion may be understood as the area having the recesses formed therein. First, according to a pattern formed on a reticle, perimeter l of the plurality of recesses formed over the entire surface of the semiconductor substrate 102 (wafer) is calculated. For example, the perimeter of certain recess A is given as (a+b+c+d). The perimeter of other certain recess B is given as (e+f+g+h). In this way, the perimeter l=(a+b+c+d+e+f+g+h . . . ) of all recesses formed over the entire surface of the semiconductor substrate 102 is calculated. Next, the perimeter l is multiplied by the depth "m" of the recesses to give the area of side walls (l×m). Thus-calculated area of side walls is added to the wafer area $S_2$ to give an actual area $S_1(=l×m+S_2)$ of the entire surface to be plated. The ratio of surface area Sr is calculated by dividing the actual area $S_1$ by the surface area of substrate $S_2$.

Referring now back to FIG. 2, whether correction is necessary or not is judged, based on the ratio of surface area Sr (S102). In this embodiment, whether the ratio of surface area Sr falls in a predetermined range or not is judged, and the correction is judged as being necessary if the ratio of surface area Sr falls in the predetermined range. The predetermined range herein may be 1.4 or above, for example. By this configuration, the plating process can smoothly be proceeded without correction if the ratio of surface area Sr is not so large, whereas the bottom-up performance can be improved by correction if the ratio of surface area Sr is large to a certain extent.

More specifically, for the case where a large number of fine recesses are formed on the semiconductor substrate 102, the area of side walls will be large, and the ratio of surface area Sr will have a large value. In this embodiment, the first plating process is carried out at first current density corrected based on the ratio of surface area Sr, if the ratio of surface area Sr is large, and therefore influences of the area of side walls of the recesses is not negligible. For the case of plating process based on bottom-up deposition, effective current density is susceptible to magnitude of the area of side walls of the recesses. In this embodiment, the thickness of film in semiconductor devices having a variety of pattern densities can be controlled in an accurate manner, because the current density is appropriately corrected corresponding to the ratio of surface area Sr.

If the correction is necessary (YES in S102), the plating process is proceeded using the first current density obtained by correcting the predetermined first reference current density based on the ratio of surface area Sr (S104). The first current density is set so as to become larger as the ratio of surface area Sr becomes larger. In this embodiment, the first current density is calculated by multiplying the first reference current density (Sr=1) having no area of side walls taken into consideration by the ratio of surface area Sr. As described previously, in this embodiment, the first reference current density is set so that the effective current density for Sr=1 falls typically in the range equal to or more than 2 mA/cm² and equal to or less than 6.5 mA/cm², and more preferably equal to or more than 3.5 mA/cm² and equal to or less than 5 mA/cm². If this sort of the first reference current is corrected based on the ratio of surface area Sr, the effective current density can be adjusted to the range typically equal to or more than 2 mA/cm² and equal to or less than 6.5 mA/cm², and more preferably equal to or more than 3.5 mA/cm² and equal to or less than 5 mA/cm², irrespective of interconnect pattern of the semiconductor device 100. It is therefore made possible to fill the recesses in a desirable manner, while avoiding abnormal plating.

The plating process will be referred to as the first plating process, hereinafter. The first plating process is carried out until the fine recesses not larger than a predetermined width (simply referred to as "fine recesses", hereinafter), out of the plurality of recesses formed in the interlayer insulating film 106, are filled by the electro-conductive material. In this embodiment, the predetermined width may be set to 0.3 μm, for example. In these fine recesses, the bottom-up performance can be improved, by correcting the first reference current density, in consideration of the ratio of surface area Sr.

It is also allowable herein to preliminarily set process time by which the filling of the fine recesses with the electro-conductive material will be completed, and to make judgment in step S106 whether the time has elapsed or not. The process time can be calculated typically as described below. First, a plurality of samples are obtained. Next, these samples are subjected to the plating process under similar plating conditions at several intervals of time. A plurality of samples are then cleft, and those having the fine recesses already filled are detected. The process time of plating consumed for the sample is defined as the process time by which the filling of the fine recesses with the electro-conductive material completes. If the amount of deposition of the film per unit time can be obtained, it is also made possible to calculate the time by which the filling of the fine recesses with the electro-conductive material completes, based on the width of the recesses.

The first plating process is terminated, upon completion of the filling of the fine recesses (YES in S106). The process step is shown in FIG. 1B. By the first plating process, the fifth interconnect trench 116 and the sixth interconnect trench 118, and any smaller fine recesses are filled with a first plated film 130.

Referring now back to FIG. 2, the plating process is carried out at the second current density (S108). The second current density may be set without correction based on the ratio of surface area Sr. In this embodiment, the second reference current density can be used as the second current density. The second current density may be set larger than the first reference current density. The plating process will be referred to as the second plating process, hereinafter. The second current density may be set typically equal to or more than 28 mA/cm$^2$ and equal to or less than 57 mA/cm$^2$ (on the basis of 20 to 40 A/wf). The second current density may more preferably be set to equal to or more than 42 mA/cm$^2$ and equal to or less than 57 mA/cm$^2$ (on the basis of 30 to 40 A/wf). The productivity can therefore be improved. Upon completion of the plating process at the second current density (YES in S110), the plating process comes to the end. The process step is shown in FIG. 1C. By the plating process at the second current density, the recesses wider than the fifth interconnect trench 116 and the sixth interconnect trench 118 are filled with a plated film 132.

Referring now back to FIG. 2, if it was judged in step S102 that correction is unnecessary (NO in S102), the normal plating process is proceeded at the first reference current density (S112), and the plating process is then terminated.

It is also possible to preliminarily calculate the process time of the first plating process and the second plating process. The process time of the first plating process may be defined as the time by which the above-described filling of the electro-conductive material into the fine recesses completes. For example, the process time for the first plating process may be set to the value ranged from 50 seconds to 80 seconds or around, and the process time for the second plating process may be set to the value ranged from 20 seconds to 50 seconds or around. These process times are merely exemplary ones, and may appropriately be set for the purpose of obtaining desired thickness of the film.

After completion of the plating process described in the above, portions of the second plated film 132 swelled out of the interconnect trenches are removed for planarization. Thereafter, formation of interlayer insulating films, formation of recesses, formation of metal film are further repeated to obtain a multi-layered interconnect structure.

A process of allowing current to flow in the direction reverse to that in the plating process may be given between the first plating process and the second plating process (between step S106 and step S108 in FIG. 2). This procedure may be carried out similarly to as described in Japanese Laid-Open Patent Publication No. 2004-270028. By this process, a part of the deposited first plated film 130 can be dissolved. Non-uniformity in concentration of additives remained on the plated film can thus be canceled, and thereby in-plane uniformity of the plated film can be improved.

As has been described in the above, according to the procedures of fabricating the semiconductor device of this embodiment, the plating process is proceeded at the first current density corrected based on the ratio of surface area Sr, until the fine recesses are filled up. The plating process can therefore proceed in the individual recesses under an equal effective current density, and thereby the film formation by plating and bottom-up can proceed in an efficient manner. After the fine recesses are filled up, the film formation can proceed by the second plating process in an efficient manner. Throughput of the plating apparatus can thus be improved. Because the bottom-up can proceed in an efficient manner, also improvement in the throughput is expectable, by virtue of saving of the process time of the CMP process after the plating process.

By the procedures described in the above, difference in the thickness of the plated film between the semiconductor devices containing fine patterns and the semiconductor devices having the large patterns formed therein can be reduced. Also the in-plane uniformity is improved.

It is to be noted that the density of interconnect pattern is actually determined by the information of individual reticle to be used. Therefore, once the procedures shown in FIG. 2 and an appropriate process time for the plating process are set to the plating apparatus for a certain reticle, the plating process for any of the recesses formed using the same reticle can be proceeded based on this setting.

Second Embodiment

This embodiment differs from the first embodiment, in that the first current density in the first plating process is corrected in a way different from as described in the first embodiment.

In this embodiment, the ratio of surface area Sr is grouped by predetermined ranges, and a correction value is set for each group. In other words, the first current density is set for each group. When the plating process is allowed to proceed at the first current density, the plating process is allowed to proceed at the first current density set for each group containing such ratio of surface area Sr of the semiconductor device. By this procedure, the recipe of the plating process can be simplified, while ensuring a desirable bottom-up.

FIG. 4 is a drawing showing a plurality of groups, ranges of the ratio of surface area Sr for the individual groups, and relations with current density to be applied.

For example, the ratio of surface area Sr in the range of $1.0 \leq Sr < 1.2$ is classified into group A. Grouping is similarly made at 0.2 intervals of Sr, for example, such as classifying the ratio of surface area Sr in the range of 1.2≦Sr<1.4 into group B.

Current value set on the plating apparatus are set so as to make the effective current density fall in a predetermined range for every group. In other words, the first current density of each group is set so as to make the effective current density, obtained by dividing the first current density by the ratio of surface area Sr, fall in the predetermined range. The predetermined range herein may be set typically in the range equal to or more than 2 mA/cm² and equal to or less than 6.5 mA/cm², and more preferably equal to or more than 3.5 mA/cm² and equal to or less than 5 A/cm². By setting in these ranges, the recesses can be filled up in a desirable manner, and abnormal plating is avoidable.

For example, it is determined that the group A having the ratio of surface area fallen in the range of 1.0≦Sr<1.2 is determined as being processed at a current value of 3 A on the plating apparatus. The first current density is then given as 4.4 A/cm². In this case, the effective current density taking the ratio of surface area Sr into consideration is given as 4.4 mA/cm² for ratio of surface area Sr=1, and as 3.6 mA/cm² for ratio of surface area Sr=1.2. Although the effective current density varies depending on values of the ratio of surface area Sr even in the same group in this way, it may be included into a desirable range by appropriate grouping.

As is known from FIG. 4, groups having larger ratios of surface area Sr need larger current value set on the plating apparatus. This type of correction of the current density based on the ratio of surface area Sr is used in a particularly effective manner, when the ratio of surface area Sr is large. For example, the ratio of surface area Sr of 2.0 is classified into group F. Current value for the plating process set on the plating apparatus in this case is determined as 5.5 A. The first current density under this setting is given as 8.0 mA/cm². The effective current density in this case, taking the ratio of surface area Sr into consideration, is given as 4.0 mA/cm².

After completion of the above-described first plating process, the second plating process similar to as described in the first embodiment is carried out.

Effects similar to those in the first embodiment can be obtained also in this embodiment. Also the process and recipe can be simplified.

Third Embodiment

This embodiment differs from the first and second embodiments, in that the correction value is re-adjusted in the course of the plating process, depending on changes in the surface area. Value of the ratio of surface area Sr decreases as the plating process advances, because the recesses are gradually filled. In this embodiment, relations between the state of advancement of the plating process and the ratio of surface area Sr at that point of time are preliminarily determined for the individual wafers having different pattern densities. The current density is varied depending on the relations.

Considering that the first surface area $S_1$ varies corresponding to the state of progress of the plating process, the plating process with the first current density includes calculating, at an intermediate stage of the process, ratio of surface area Sr by dividing the first surface area $S_1$ at that stage by the second surface area $S_2$, and allowing the plating process to proceed at the first current density corrected based on this ratio of surface area Sr. For example, the first plating process can be configured as allowing a plating process to proceed at the first reference current density corrected based on the first surface area $S_1$ before the plating process, and then sequentially allowing a plating process to proceed at the first reference current density corrected based on the first surface area $S_1$ achieved in midway of the plating process.

Figure 5:
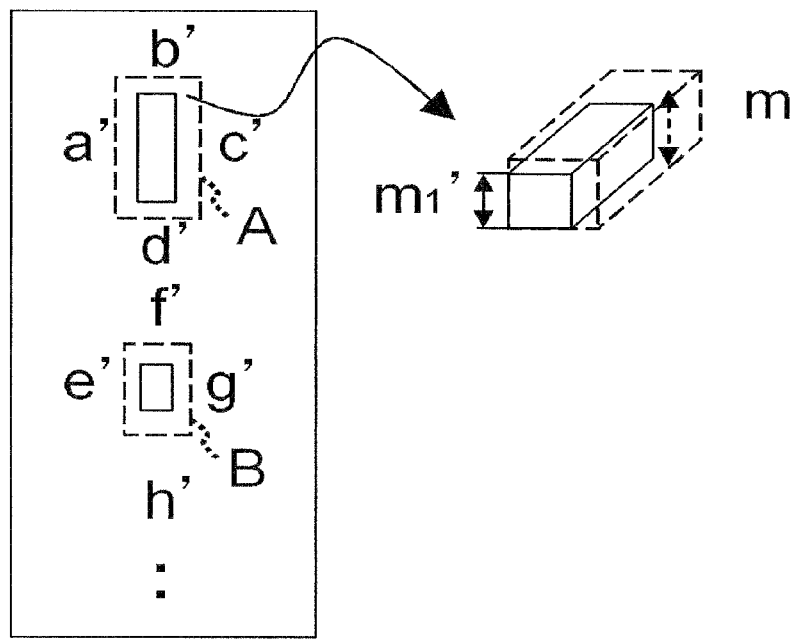
FIG. 5 is a schematic drawing explaining procedures of calculating ratio of surface area Sr in the embodiment of the present invention.

FIG. 5 is a schematic drawing explaining procedures of calculating ratio of surface area Sr in this embodiment.

Explanation herein will be made referring to exemplary recess A and recess B. The recess A and the recess B before the plating process are indicated by broken lines. The recess A before the plating process shows a perimeter of (a+b+c+d), similarly to as shown in FIG. 3. The recess B before the plating process shows a perimeter of (e+f+g+h). Both of the recess A and the recess B have a depth of "m".

At a certain stage in the course of the plating process, the perimeter $1_1'$ of the recess A is given as $1_1'=(a'+b'+c'+d')$. The depth of the recess A at that time is given as $m_1'$. The area of side walls of the recess A will be $1_1' \times m_1'$. At the same stage, the perimeter $1_2'$ of the recess B is given as $1_2'=(e'+f'+g'+h')$. The depth of the recess B at that time is given as $m_2'$. The areas of side walls of the recess B will be $1_2' \times m_2'$. Also the area of the side walls of other recesses are preliminarily calculated for every pattern. For every pattern, the perimeter is defined as $(1_1', 1_2', 1_3' \ldots)$, the depth as $(m_1', m_2', m_3' \ldots)$, and the number of patterns as $(p_1', p_2', p_3' \ldots)$. In this case, the real area $S_3$ of the entire surface to be plated at this stage is given as $1_1' \times m_1' \times p_1' + 1_2' \times m_2' \times p_2' \ldots + S_2$). The ratio of surface area Sr at this stage can be calculated by dividing the real area $S_3$ by the surface area $S_2$ of the substrate. This processing is repeated for every step of the plating process. By these procedures, the effective current density can be made uniform over the entire range of the plating process, and the film can be formed in a desirable manner.

Also in the second plating process in which the plating process is proceeded at the second current density, the correction can be made in consideration of the ratio of surface area Sr at a certain stage. The plating process of this embodiment may adopt any of the procedures shown below.

(1) the first plating process is repeated multiple number of times, and then the second plating process is carried out without considering the ratio of surface area Sr, similarly to as in the first embodiment and the second embodiment;

(2) the first plating process is repeated multiple number of times, and also the second plating process is carried out at the second current density set in consideration of the ratio of surface area Sr; and (3) the first plating process is carried out once, and also the second plating process is carried out at the second current density set in consideration of the ratio of surface area Sr.

For the cases of (2) and (3) in the above, the second current density can be calculated by correcting the second reference current density, based on ratio of surface area $Sr=S_3/S_4$ of a third surface area $S_3$ which includes the area of side walls of the plurality of recesses over the entire surface of the semiconductor substrate, at the point of time when the fine recesses not larger than a predetermined width, out of all of the plurality of recesses, were filled with the electro-conductive material, and a fourth surface area $S_4$ which does not include the area of side walls of the plurality of recesses.

In this embodiment, the film thickness and uniformity can be controlled in an accurate manner, by finely correcting the current density corresponding to the ratio of surface area which varies with progress of the plating process.

Also in this embodiment, similarly to as in the first embodiment, by setting once an appropriate process time for the plating process to the plating apparatus for a certain reticle, the plating process for any of the recesses formed using the same reticle can be proceeded based on this setting.

Fourth Embodiment

In this embodiment, a configuration of a plating apparatus 200 used for the plating process explained in the first to third embodiments will be explained.

Figure 6:
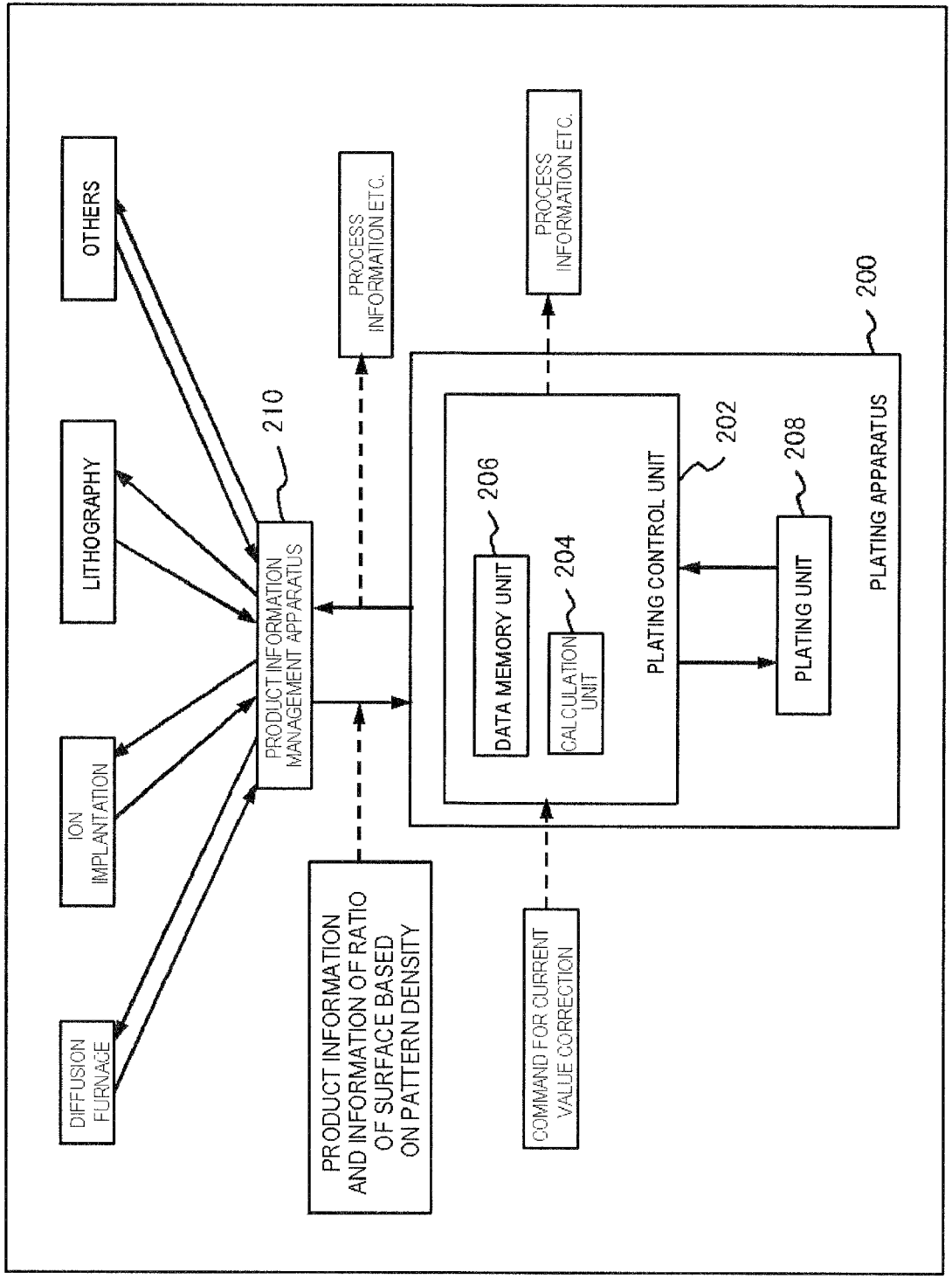
FIG. 6 is a block diagram showing a configuration of a plating apparatus in the embodiment of the present invention.

FIG. 6 is a block diagram showing a configuration of a plating apparatus in the embodiment of the present invention.

The plating apparatus 200 includes a plating control unit 202 and a plating unit 208. The plating control unit 202 includes a calculation unit 204 and a data memory unit 206. A product information management unit 210 takes part in centralized management of process conditions determined for every product and results of the process.

The plating apparatus 200 acquires the ratio of surface area Sr of the substrate to be plated from the product information management unit 210. The data memory unit 206 stores current value for the case where the ratio of surface area Sr is 1. The calculation unit 204 reads the current value for the case where the ratio of surface area Sr is 1 out from the data memory unit 206, and calculates an appropriate current density, based on the current value and a value of the ratio of surface area Sr acquired from the product information management unit 210. The plating control unit 202 outputs a current value calculated by the calculation unit 204 to the plating unit 208. The plating unit 208 carries out the plating process at the current value output from the plating control unit 202.

For the case where this sort of plating apparatus 200 is used, the correction on the current density corresponding to the individual product information is very labor-consuming, because the correction must be repeated multiple number of times equivalent to the number of product types multiplied by the number of plated layers. It is therefore preferable to adopt a configuration by which preset product information is automatically transmitted from the product information management unit 210 to the plating apparatus 200. It is further preferable that this correction is automatically made as a consequence.

EXAMPLES

In Examples and Comparative Examples below, a plating process was carried out for a semiconductor device having a ratio of surface area Sr of 2.7. The current density on the wafer without correction (first reference current density) was set to 4.2 mA/cm². The ratio of surface area Sr before the plating process was 2.7.

Example

First plating process: The first reference current density was corrected by the ratio of surface area Sr, and the first current density was adjusted to 4.2 mA/cm²×2.7=11.34 mA/cm². The film formation was proceeded for 60 seconds.

Second plating process: The second current density was adjusted to 28 mA/cm². The film formation was proceeded for 40 seconds.

Comparative Example

First plating process: The first reference current density was directly applied as the first current density without correction, adjusted to 4.2 mA/cm². The film formation was proceeded for 60 seconds.

Second plating process: The second current density was adjusted to 28 mA/cm². The film formation was proceeded for 40 seconds.

The semiconductor devices of Example and Comparative Example after completion of the plating processes were cleft, and the thickness of the plated film was measured. In Example, an excessive thickness of the film up and above the recesses was found to be 20 to 100 nm. On the other hand, in Comparative Example, the plated film was found to incompletely fill the recesses, leaving voids in some recesses. This is supposedly because the plating process phased into the second plating process before the fine recesses were thoroughly filled due to incomplete first plating process, leaving the voids in some recesses.

In Comparative Example, no correction based on the ratio of surface area Sr was made. As a consequence, when the current density on the wafer is 4.2 mA/cm², the effective current density in consideration of the area of side walls of the recesses becomes as small as a value obtained by dividing 4.2 mA/cm² by 2.7 (approximately 1.56 mA/cm²). Reduction in the effective current density proportionally reduces the thickness of the plated film. To compensate the reduction, it is necessary to increase the process time for the first plating process longer than 60 seconds. Failure in the filling, however, cannot be solved even if the process time is increased, if the effective current density is smaller than 2 mA/cm², due to degraded bottom-up performance.

The present invention has been described referring to the embodiments and Example. It will readily be understood by those skilled in the art that these embodiments and Example are merely exemplary ones, allowing various modifications, and that also the modifications and combinations of them are within the scope of the present invention.

It is apparent that the present invention is not limited to the above embodiment, that may be modified and changed without departing from the scope and spirit of the invention.

What is claimed is:

1. A method of fabricating a semiconductor device having a plating process of filling a plurality of recesses provided to an insulating film formed on a substrate with an electro-conductive material, comprising the steps of:
   determining a first surface area $S_1$ of over an entire surface of said substrate which includes the area of side walls of said plurality of recesses over the entire surface of said substrate;
   determining a second surface area $S_2$ of over an entire surface of said substrate which excludes said area of side walls of said plurality of recesses;
   determining a ratio of surface area $Sr=S_1/S_2$; and
   performing the plating with a first current density when fine recesses not larger than a predetermined width, out of all of said plurality of recesses, are filled with said electro-conductive material, said first current density being obtained by correcting a predetermined first reference current density based on the determined ratio of surface area $Sr=S_1/S_2$.

2. The method of fabricating a semiconductor device as claimed in claim 1, wherein, said first reference current density is set on the basis of said second surface area $S_2$, and said first current density is a product of said first reference current density and said ratio of surface area Sr.

3. The method of fabricating a semiconductor device as claimed in claim 1, wherein said first current density is set so as to make effective current density, which is obtained by dividing said first current density with said ratio of surface area Sr, fall within a predetermined range.

4. The method of fabricating a semiconductor device as claimed in claim 3, wherein said predetermined range is equal to or more than 2 mA/cm$^2$ and equal to or less than 6.5 mA/cm$^2$.

5. The method of fabricating a semiconductor device as claimed in claim 3, further including grouping said ratio of surface area Sr by predetermined ranges, and setting said first current density for every said group, wherein, in said performing the plating with said first current density, said first current density is set for said group containing said grouped ratio of surface area Sr.

6. The method of fabricating a semiconductor device as claimed in claim 1, wherein said plating process further includes processing the plating with a second current density different from said first current density, after said fine recesses not larger than said predetermined width, out of all of said plurality of recesses, are filled with said electro-conductive material, so as to fill said plurality of recesses with said electro-conductive material.

7. The method of fabricating a semiconductor device as claimed in claim 6, wherein said first reference current density is smaller than said second current density.

8. The method of fabricating a semiconductor device as claimed in claim 6, wherein said second current density is a second reference current density set on the basis of said second surface area $S_2$.

9. The method of fabricating a semiconductor device as claimed in claim 6, wherein said second current density is obtained by correcting a second reference current density set on the basis of said second surface area $S_2$, based on ratio of surface area Sr=$S_3/S_4$ of a third surface area $S_3$ over the entire surface of said substrate which includes the area of side walls of said plurality of recesses over the entire surface of said substrate, at the point of time when said fine recesses not larger than said predetermined width, out of all of said plurality of recesses, are filled with said electro-conductive material, and a fourth surface area $S_4$ over the entire surface of said substrate which does not include said area of side walls of said plurality of recesses.

10. The method of fabricating a semiconductor device as claimed in claim 1, wherein in performing the plating with said first current density, considering that said first surface area $S_1$ varies with progress of said plating, said first current density is obtained by correcting said first reference current density based on the ratio of surface area Sr, said ratio of surface area Sr being calculated, at a certain stage in the course of plating, by dividing a value of said first surface area $S_1$ achieved at said stage with said second surface area $S_2$.

11. The method of fabricating a semiconductor device as claimed in claim 1, wherein said predetermined width is 0.3 μm.

12. The method of fabricating a semiconductor device as claimed in claim 1, further comprising judging whether said ratio of surface area Sr falls in a predetermined range or not, before said performing the plating with said first current density, wherein when said ratio of surface area Sr is judged as being in said predetermined range, allowing said performing the plating with said first current density, and when said ratio of surface area Sr is judged as being out of said predetermined range, allowing said performing the plating with said first reference current density instead of using said first current density.

13. The method of fabricating a semiconductor device as claimed in claim 12, wherein said predetermined range is 1.4 or larger.

14. The method of fabricating a semiconductor device as claimed in claim 1, wherein said first current density is set larger as said ratio of surface area Sr becomes larger.

15. The method of fabricating a semiconductor device as claimed in claim 12, wherein when said ratio of surface area Sr is judged as being in said predetermined range, the plating process is proceeded in two steps in which one of said first current density and another current density is used, respectively, and when said ratio of surface area Sr is judged as being out of said predetermined range, the plating process is proceeded in one step using said first reference current density.

* * * * *